(12) United States Patent
Miyashita et al.

(10) Patent No.: US 7,820,492 B2
(45) Date of Patent: Oct. 26, 2010

(54) ELECTRICAL FUSE WITH METAL SILICIDE PIPE UNDER GATE ELECTRODE

(75) Inventors: Katsura Miyashita, Kanagawa (JP); Yoshiaki Toyoshima, Chiba (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 361 days.

(21) Appl. No.: 11/753,837

(22) Filed: May 25, 2007

(65) Prior Publication Data
US 2008/0290456 A1 Nov. 27, 2008

(51) Int. Cl.
*H01L 21/82* (2006.01)

(52) U.S. Cl. ............... 438/131; 438/467; 438/600; 257/530

(58) Field of Classification Search .......... 257/530; 438/131, 467, 600
See application file for complete search history.

(56) References Cited

U.S. PATENT DOCUMENTS

| 6,492,670 | B1 * | 12/2002 | Yu | 257/284 |
| 6,661,330 | B1 | 12/2003 | Young | |
| 7,015,076 | B1 * | 3/2006 | Chan et al. | 438/131 |
| 2002/0182827 | A1 * | 12/2002 | Abe et al. | 438/455 |
| 2004/0087120 | A1 * | 5/2004 | Feudel et al. | 438/525 |

* cited by examiner

*Primary Examiner*—Zandra Smith
*Assistant Examiner*—Paul E Patton
(74) *Attorney, Agent, or Firm*—Banner & Witcoff, Ltd.

(57) ABSTRACT

An electrical fuse (eFuse) has a gate prepared from a conductive or partially conductive material such as polysilicon, a semiconductor substrate having a pipe region in proximity to the gate, and first and second electrode regions adjacent the pipe region. A metal silicide layer is provided on the semiconductor substrate adjacent the pipe region. When a programming voltage is applied, the metal silicide undergoes a thermally induced phase transition in the pipe region. The eFuse has improved reliability and can be programmed with relatively low voltages.

16 Claims, 11 Drawing Sheets

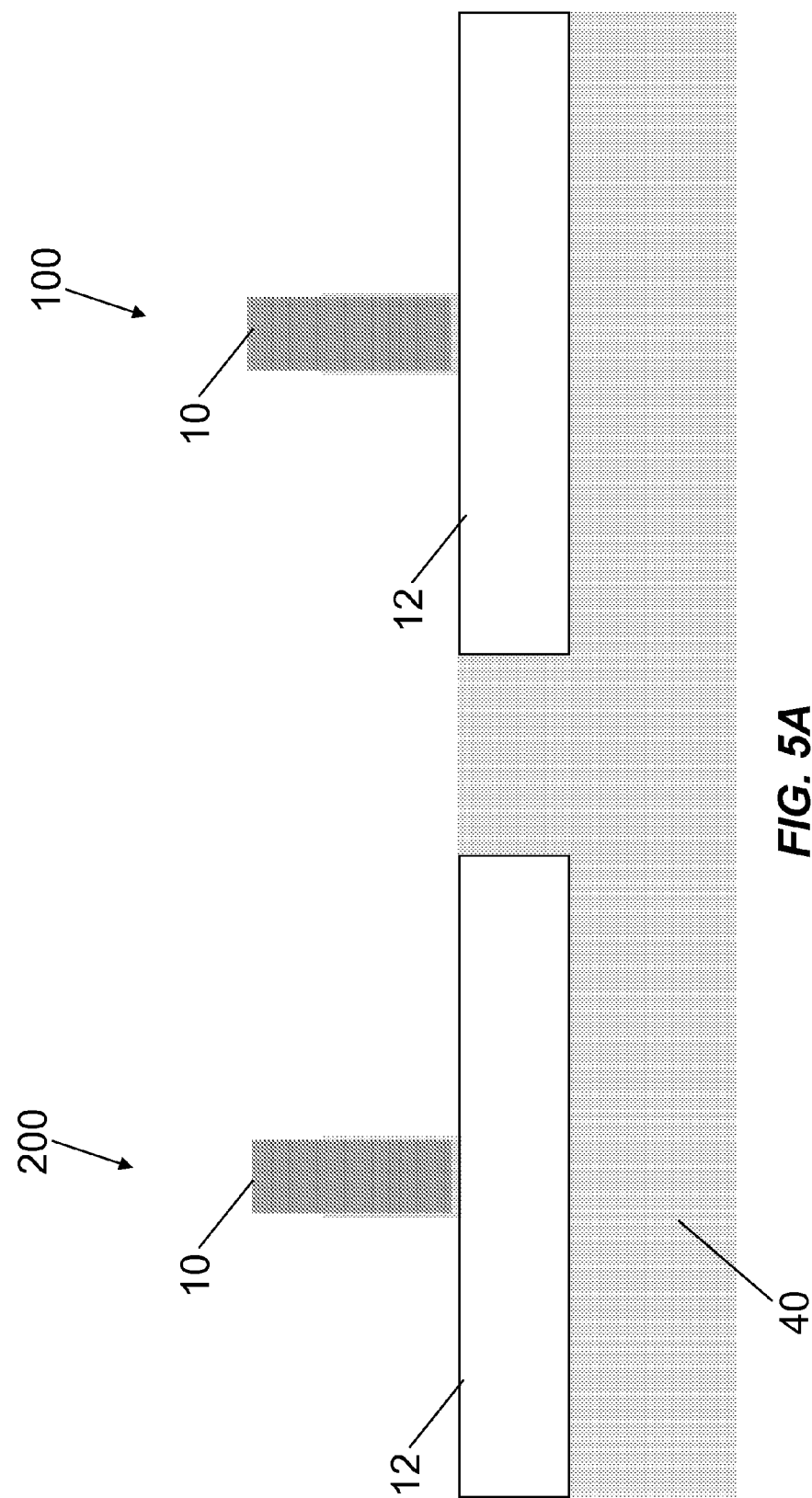

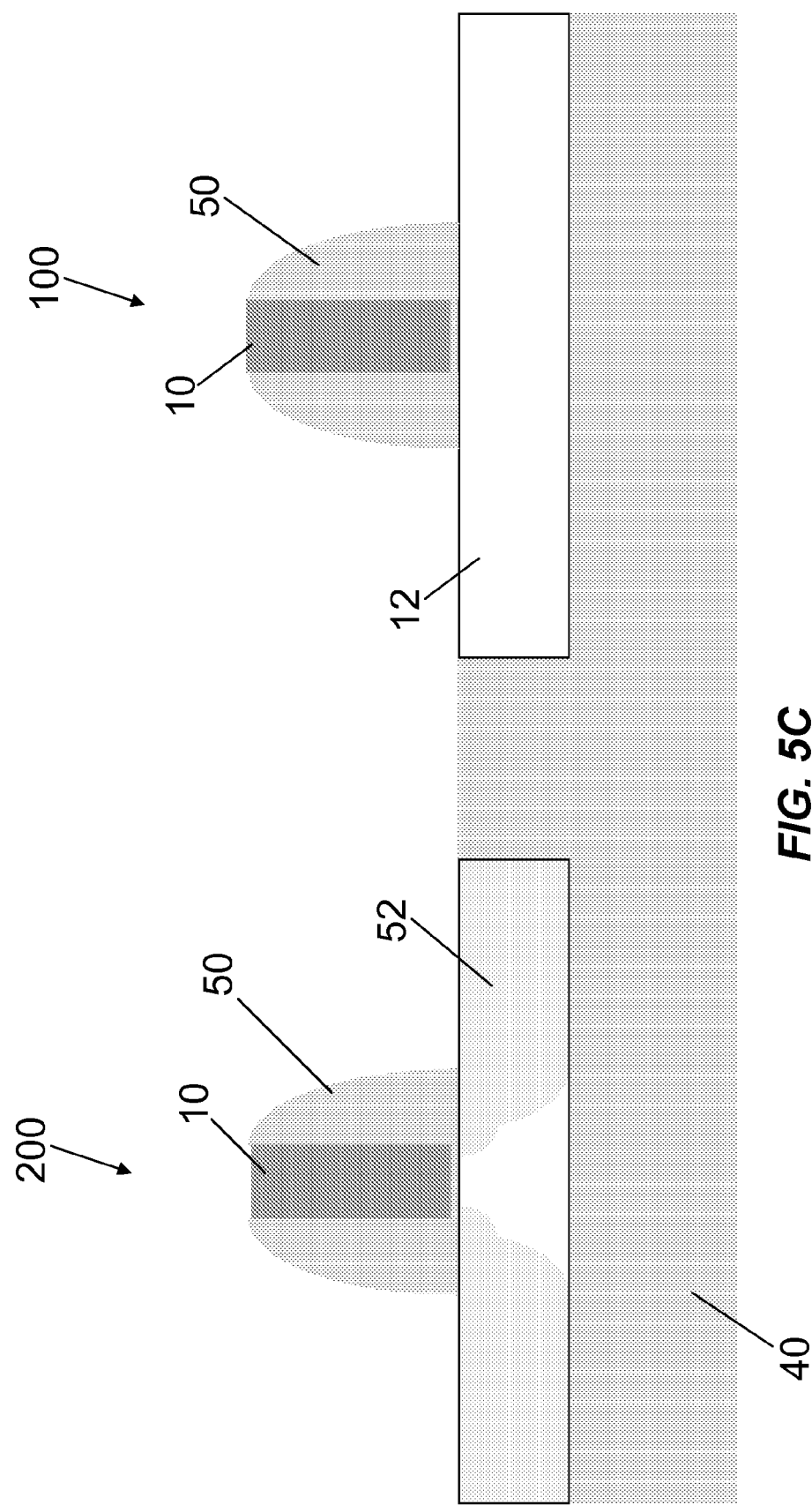

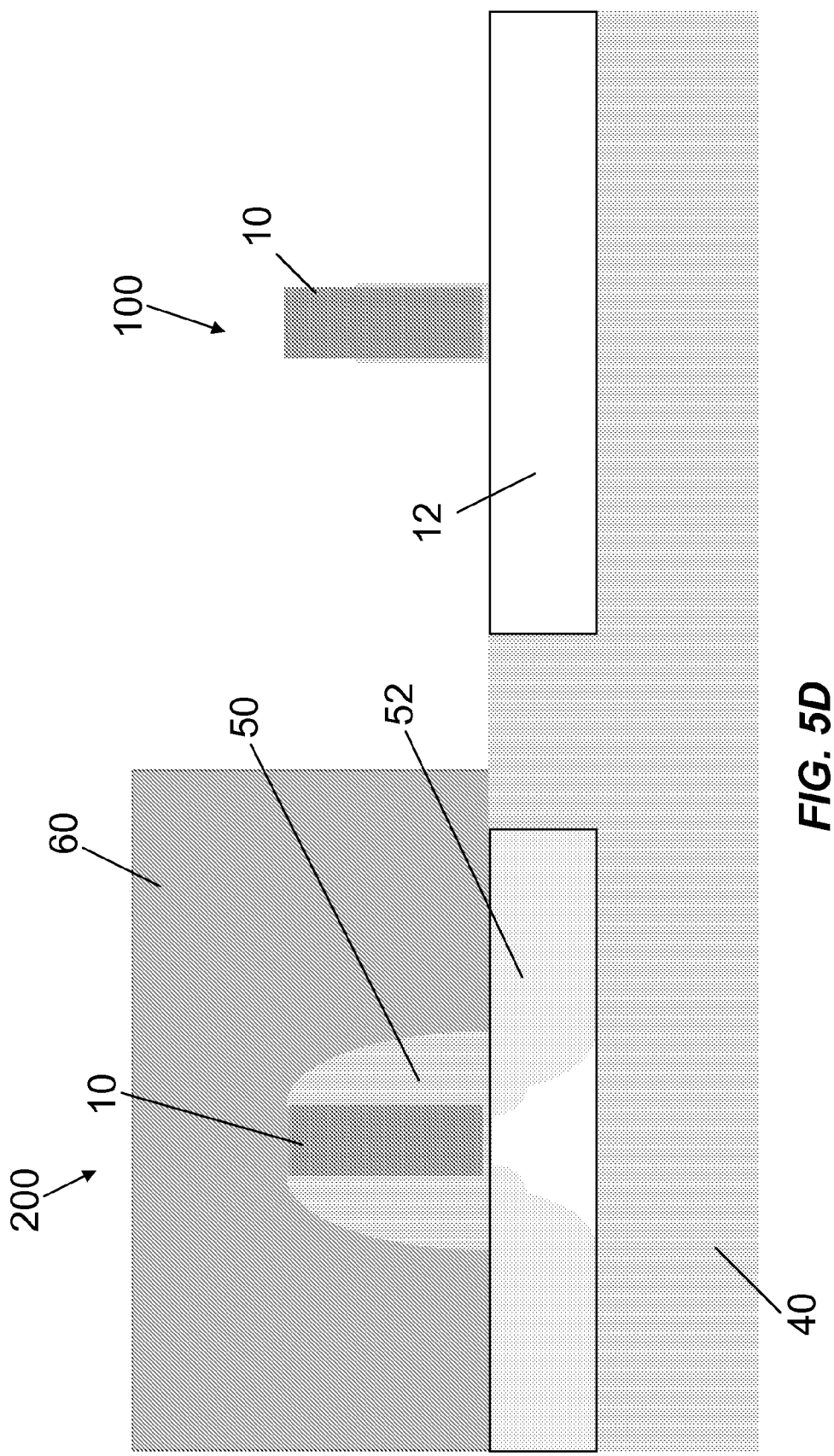

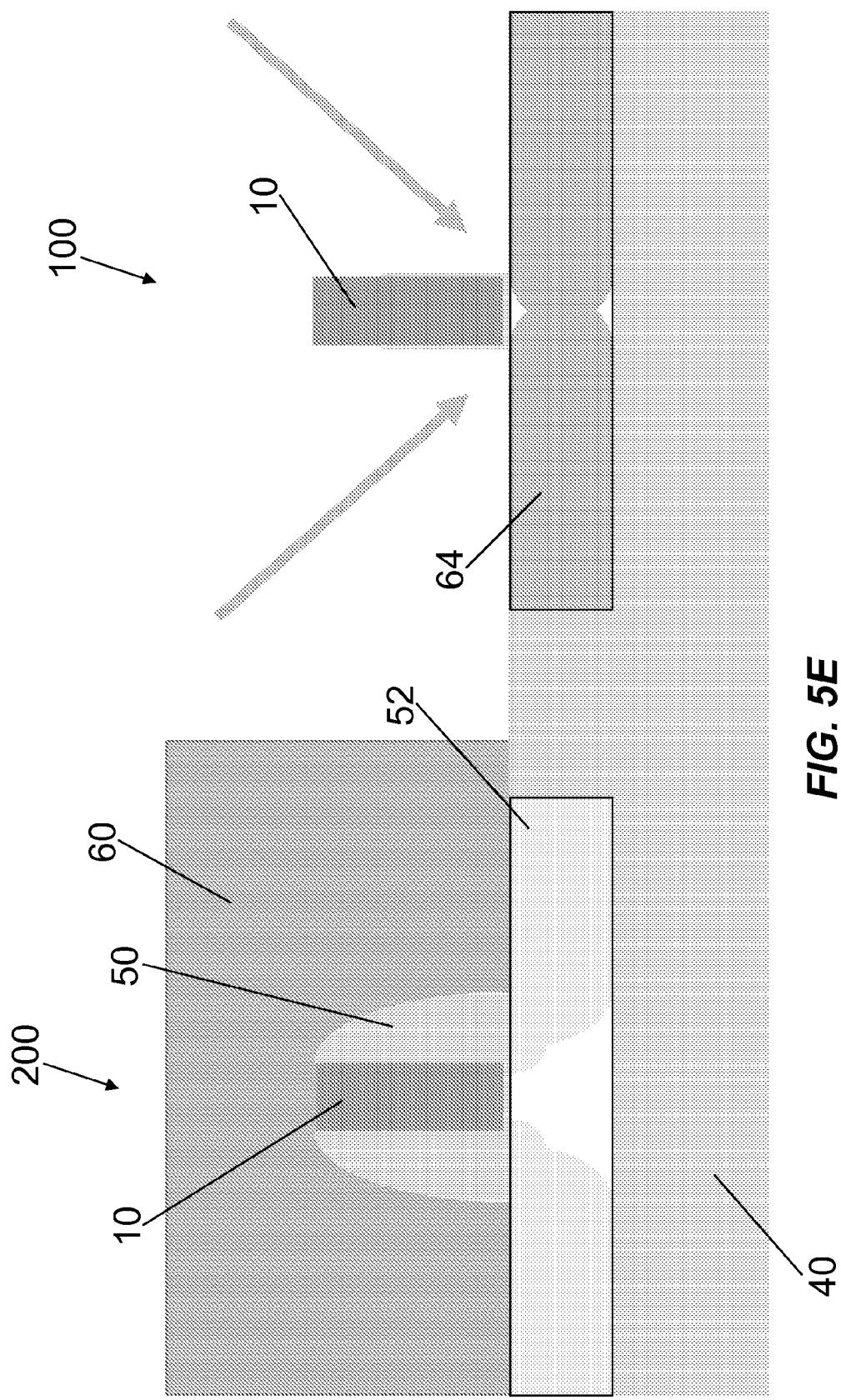

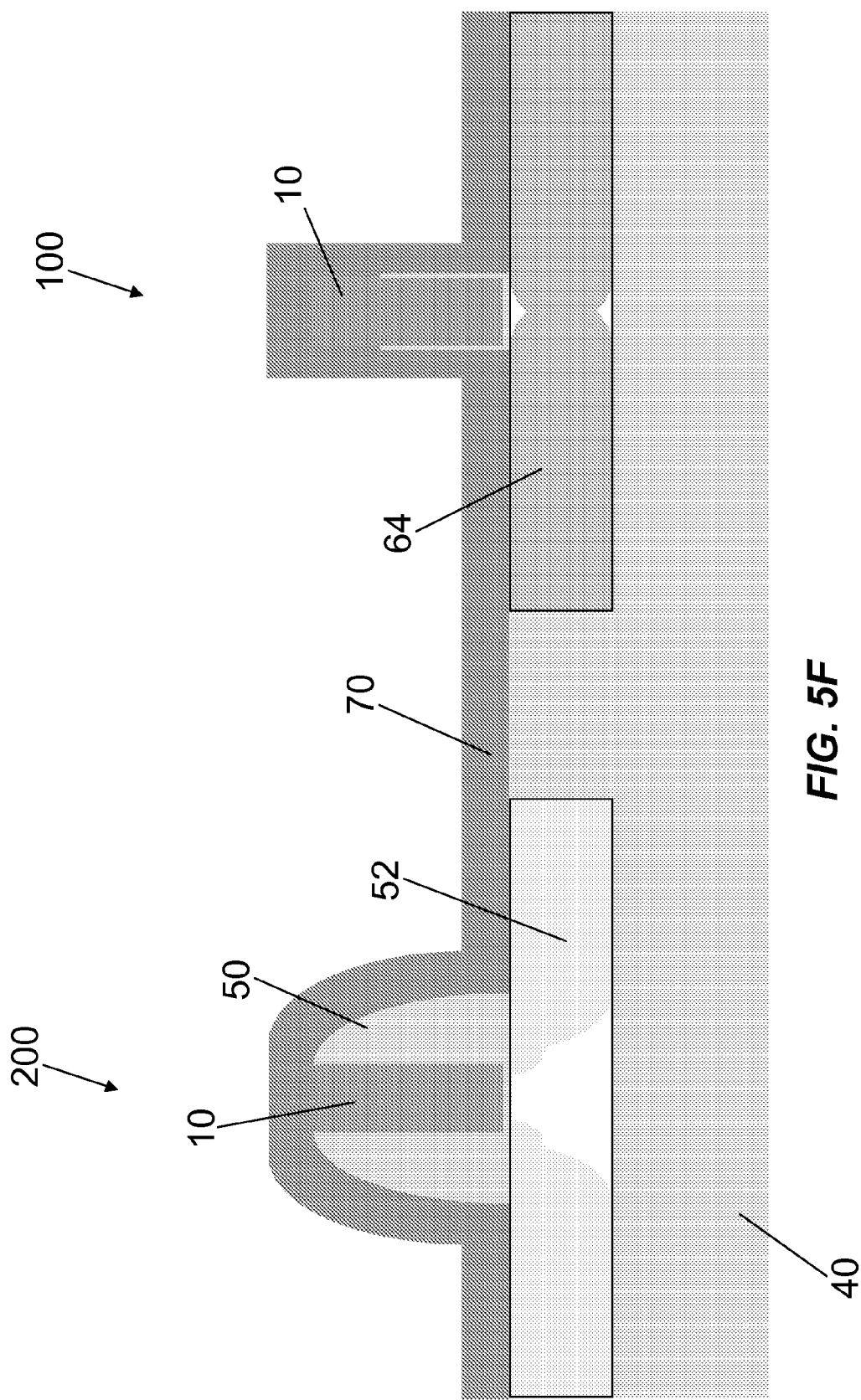

US 7,820,492 B2

ELECTRICAL FUSE WITH METAL SILICIDE PIPE UNDER GATE ELECTRODE

FIELD OF THE INVENTION

The present invention is directed to electrical fuses (eFuses) and, more particularly, to an anti-eFuse resistor utilizing a metal silicide pipe connecting two electrical nodes.

DESCRIPTION OF RELATED ART

Electrical fuses (eFuses) have replaced laser fuses in many large scale integration (LSI) product chips due to several advantages, such as occupying less space on chips and increased flexibility in back-end integration schemes with a low-k dielectric. EFuses also are less prone to corrosion, crack, and splatter issues than are laser fuses.

Most eFuses are designed to change the value of a resistor by rupturing it. In general, sensing voltage and programming voltage are sufficiently high (e.g., 3.3 V) to rupture the resistor. As process technology has progressed to smaller and smaller geometries, maximum operating voltages have been scaled downward, making it more difficult to get power to eFuses. Also, it is usually desirable to minimize the amount of current required by the programming operation so that metallization power buses that deliver current to the eFuses do not need to be large.

Anti-fuse technology is currently being used in a variety of applications, including programmable read-only memories (PROMs), field-programmable gate arrays (FPGAs), programmable array logic (PAL) devices. Very large system integration (VLSI) chips which include SRAM and/or DRAM also have benefited from anti-fuse technology for redundancy circuits because anti-fuses have relaxed layout restrictions and are less affected by back end of the line (BEOL) processes than are laser-blown fuses.

One common difficulty encountered in programming eFuses when encountering significant voltage limitations, for example in sub-nanometer technologies, is providing enough power to reliably blow the fuse in a single programming pulse. Multiple programming pulses are sometimes required to achieve the desired resistance, rendering the eFuses less reliable and less efficient.

There remains a need for improved eFuses, particularly eFuses with improved reliability and which can be programmed with relatively low voltages. It would be particularly desirable to develop improved anti-fuse technology that is compatible with logic-based embedded memory LSI chips.

SUMMARY OF THE INVENTION

The present invention, according to one aspect, is directed to an electrical fuse (eFuse) having a semiconductor substrate and a gate prepared from a conductive or partially conductive material, such as polysilicon. The semiconductor substrate has a pipe region in proximity to the gate, and first and second electrode regions adjacent the pipe region. A metal silicide layer is disposed on the semiconductor substrate adjacent the pipe region.

According to another aspect of the invention, a method of manufacturing an electrical fuse includes providing a semiconductor substrate and forming a conductive or partially conductive gate on the semiconductor substrate. The semiconductor substrate has a pipe region in proximity to the gate and first and second electrode regions adjacent the pipe region. A metal nitride layer is deposited on the semiconductor substrate in the first and second electrode regions.

Examples of metal silicides that can be used include nickel silicide (NiSi), cobalt silicide ($CoSi_x$), titanium silicide ($TiSi_x$), and palladium silicide ($Pd_2Si$), where x is 1 or 2. The gate produces heat when a programming voltage is applied. Heat causes the metal silicide to migrate into the pipe region, where it undergoes a phase transition to form a species exhibiting different resistance. According to one aspect, the pipe region is amorphized, e.g., by ion implantation or the like, to increase the ability of the metal silicide to infuse to the pipe region.

The eFuses of the present invention have high reliability and can be programmed with relatively low voltages and can be compatible with logic-based embedded memory LSI chips.

BRIEF DESCRIPTION OF THE DRAWINGS

The objects, features, and advantages of the invention will be apparent from the following more detailed description of certain embodiments of the invention and as illustrated in the accompanying drawings in which:

FIGS. 5A-5H illustrate an exemplary method for manufacturing an eFuse in accordance with the present invention together with a metal oxide semiconductor field effect transistor (MOFSET); FIG. 5A illustrates shallow trench isolation (STI) and gate formation on a silicon-on-insulator (SOI) substrate; FIG. 5B illustrates extension/halo implant and spacer formation on the MOSFET and spacer formation on the anti-fuse; FIG. 5C shows deep source/drain implant and dopant activation annealing on the MOSFET; FIG. 5D illustrates resist formation on the MOSFET and nitride spacer etching at fuse area; FIG. 5E shows a tilted amorphization implant to the fuse area; FIG. 5F shows Ni/TiN deposition; FIG. 5G shows NiSi formation by annealing and selective wet etching; and FIG. 5H shows MOL deposition and W contact plug formation.

DETAILED DESCRIPTION OF THE INVENTION

It is noted that various connections are set forth between elements in the following description. It is noted that these connections in general and, unless specified otherwise, may be direct or indirect and that this specification is not intended to be limiting in this respect.

The eFuses of the present invention can be used in a variety of applications, non-limiting examples of which include silicon-on-insulator complementary metal oxide semiconductor large system integration (SOI CMOS LSI) devices, bulk CMOS LSI devices, programmable read-only memories (PROMs), field-programmable gate arrays (FPGAs), programmable array logic (PAL) devices, and very large system integration (VLSI) chips with SRAM and/or DRAM.

Figure 1:
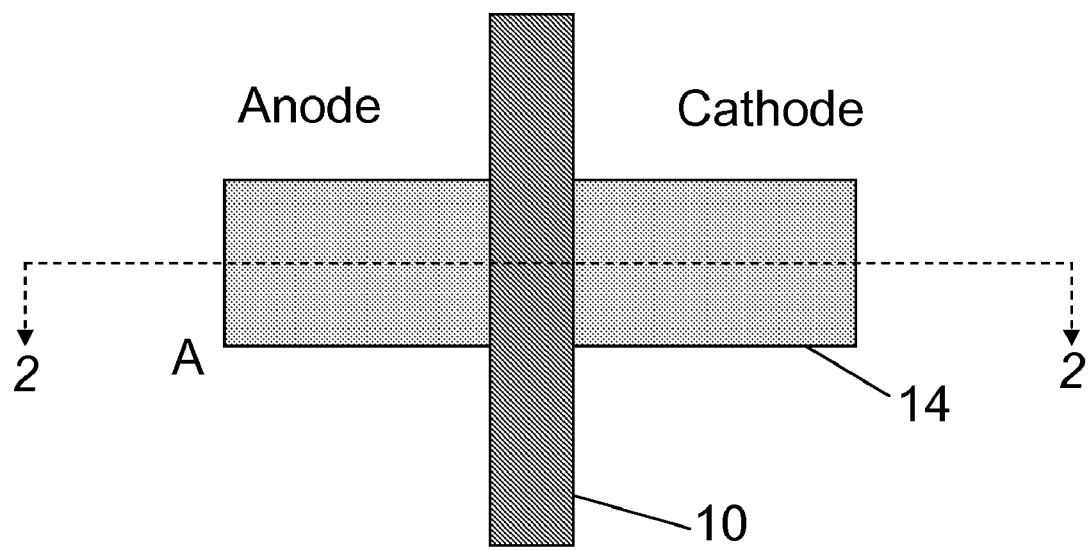
FIG. 1 is a top plan view of an anti-eFuse having a NiSi pipe structure in accordance with one exemplary embodiment of the present invention.
Figure 2:
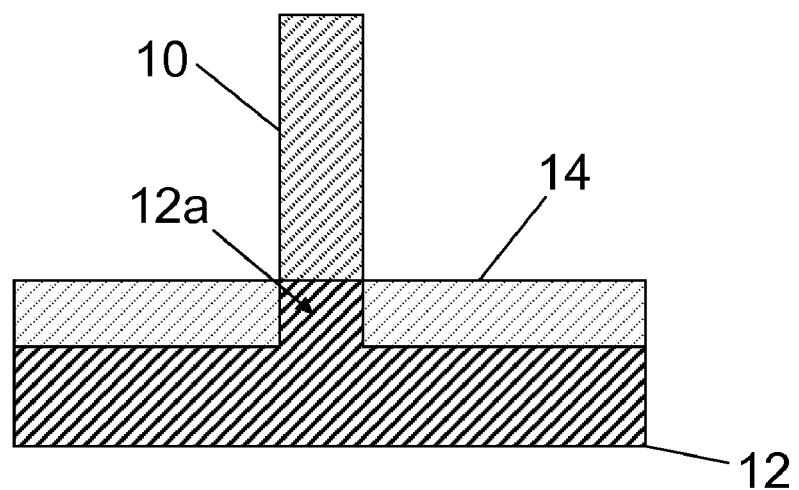
FIG. 2 is a cross-sectional view of the anti-eFuse shown in FIG. 1.

With reference to FIGS. 1 and 2, an exemplary eFuse has a silicon semiconductor substrate 12 and a polysilicon gate 10. The semiconductor substrate 12 has a pipe region 12a located in an area generally below the polysilicon gate 10. The pipe region 12a is shown as being integral with the semiconductor substrate 12. Alternatively, the pipe region 12a can be a separate layer. The eFuse has anode and cathode regions adjacent the pipe region 12a, as shown in FIG. 1. A nickel silicide (NiSi) layer 14 is provided on the semiconductor substrate 12 in the anode and cathode regions, e.g., in the areas adjacent the pipe region 12a.

Figure 3A:
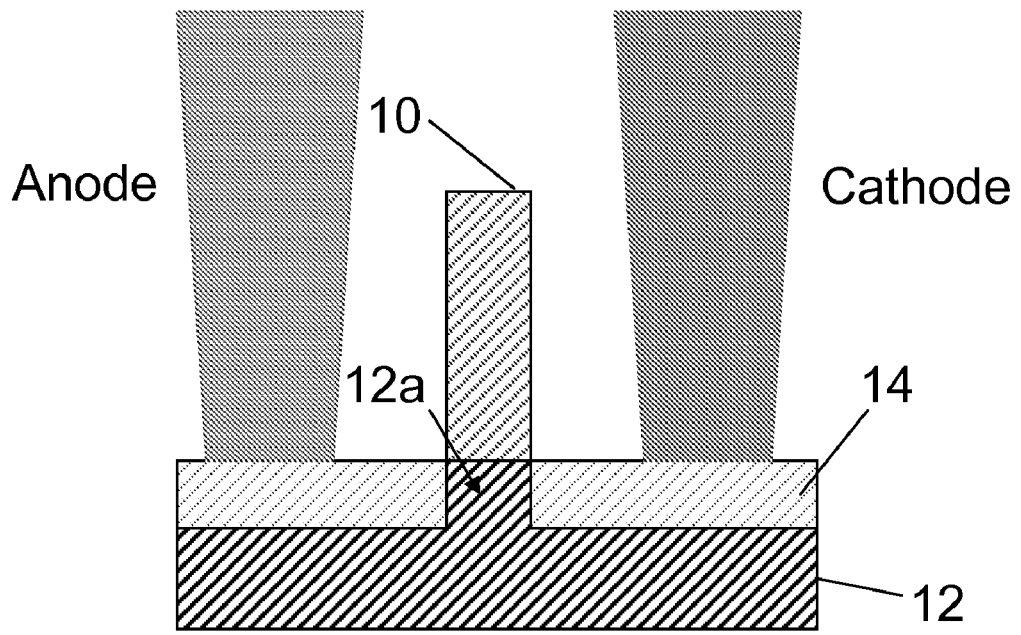
FIG. 3A is a cross-sectional view of an anti-eFuse in the unprogrammed state, which has relatively high resistance due to the Shotkey diodes.
Figure 3B:
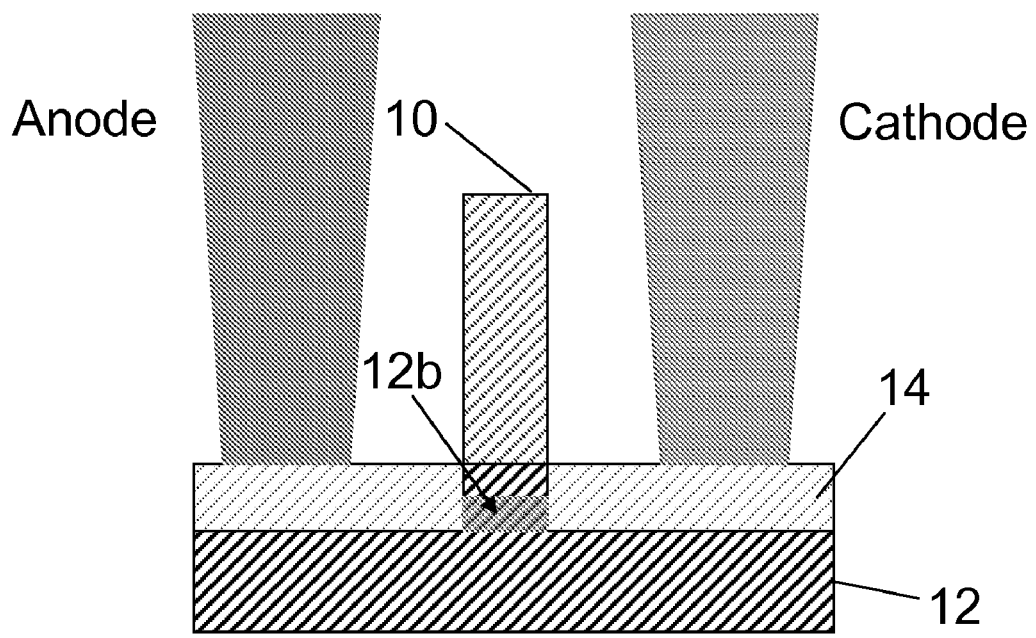
FIG. 3B is a cross-sectional view of an anti-eFuse in the programmed state, which has relatively low resistance due to the formation of a $NiSi_x$ conductor.
Figure 4A:
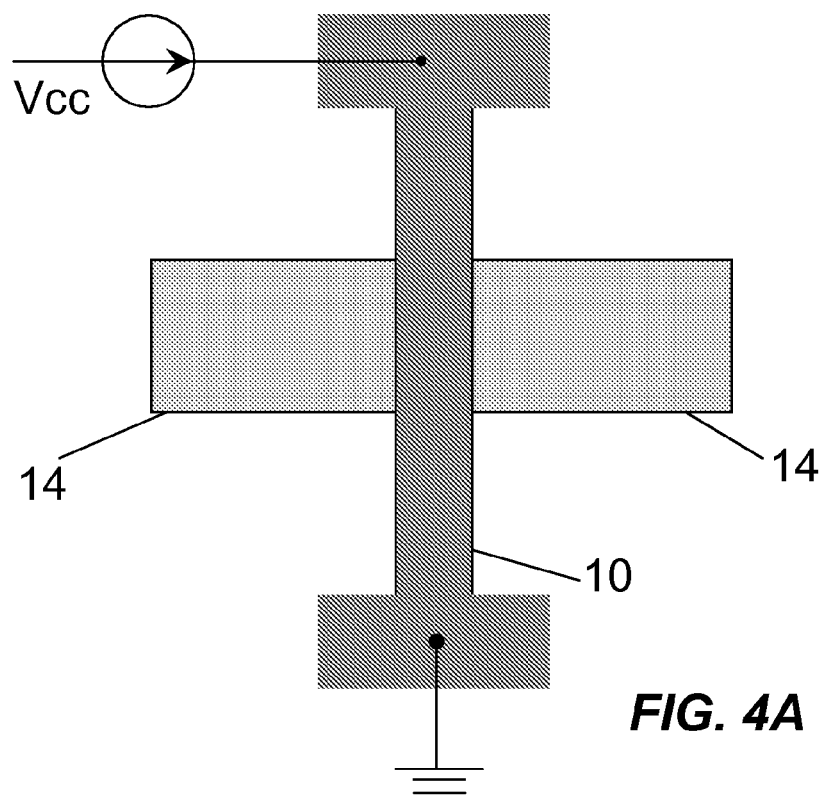
FIG. 4A is a top plan view of an anti-eFuse in the unprogrammed state in accordance with an exemplary embodiment of the present invention.
Figure 4B:
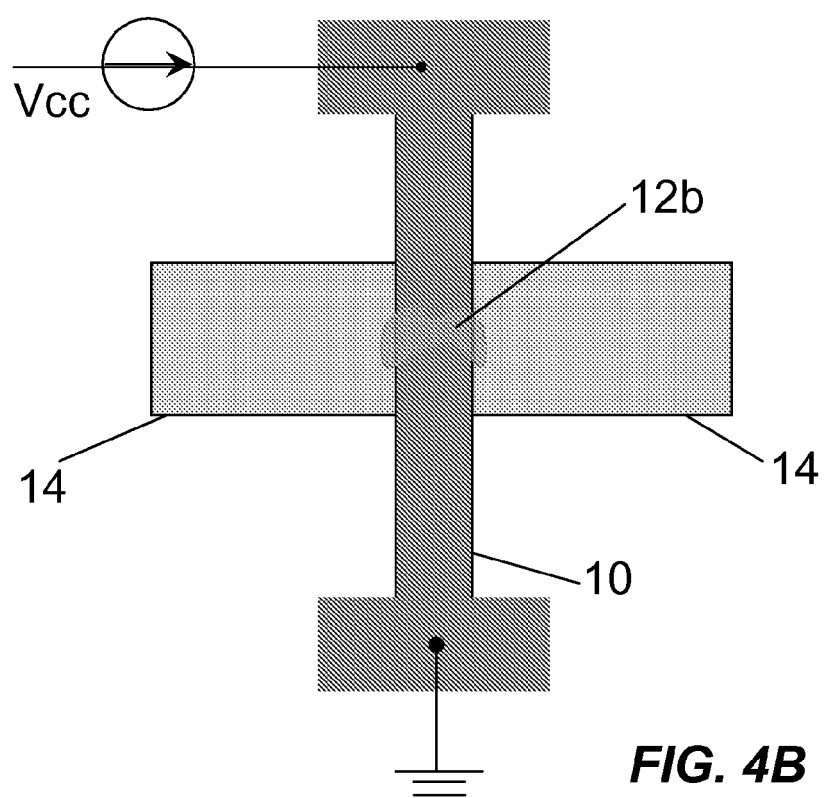
FIG. 4B is a top plan view of the anti-eFuse of FIG. 4A in the programmed state; the $NiSi_x$ conductor formed in the pipe region illustrated.

FIGS. 3A and 4A illustrate cross-sectional and top plan views, respectively, of an anti-eFuse in the unprogrammed state. In the unprogrammed state, the anti-eFuse has relatively high resistance due to the Shotkey diodes. FIGS. 3B and 4B illustrate cross-sectional and top plan views, respectively, of the anti-eFuse in the programmed state. The anti-eFuse can be programmed by applying a relatively low voltage to create a thermally induced phase change. Typically, the programming voltage ranges from about 1.5 to about 3.3 V. The voltage heats the gate 10 and the underlying pipe region 12a, which causes the adjacent NiSi to migrate into the pipe region to cause a phase change thereby forming an area 12b (sometimes referred to as a "pipe") of lower resistance.

Non-limiting examples of metal silicides that can be used include nickel silicide (NiSi), cobalt silicide ($CoSi_x$), titanium silicide ($TiSi_x$), and palladium silicide ($Pd_2Si$), platinum silicide (PtSi), erbium silicide ($ErSi_x$), and combinations thereof, where x is varied from 0.3 to 3. In one exemplary embodiment, the metal silicide is NiSi. When a programming voltage is applied, the gate 10 generates heat, which causes the metal silicide to react with silicon present in the pipe region 12a, as illustrated by the equation below:

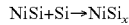

$$NiSi + Si \rightarrow NiSi_x$$

where x>1, typically 2-3. The $NiSi_x$ area 12b expands and connects the metal silicide at the source and drain sides, as illustrated in FIGS. 3B and 4B.

In logic-based memory chips of nanometer (e.g., 65 nm) technology and beyond, nickel silicide has been utilized for SALICIDE material. NiSi is superior in low resistivity with narrow gate electrodes and narrow active areas as compared to other metal silicides. NiSi has a tendency to diffuse into substrates with crystal defects caused by high dose implants. These properties render NiSi particularly well suited for the metal silicide layer in the eFuse.

In one embodiment, crystal defects are generated intentionally under the gate 10 so that the metal silicide diffuses more efficiently into the pipe region 12a. Crystal defects can be generated using a variety of techniques well known to persons skilled in the art, such as tilted amorphization implant using, for example, one or more of F, Ge, Si, Xe, and As.

Figure 5B:
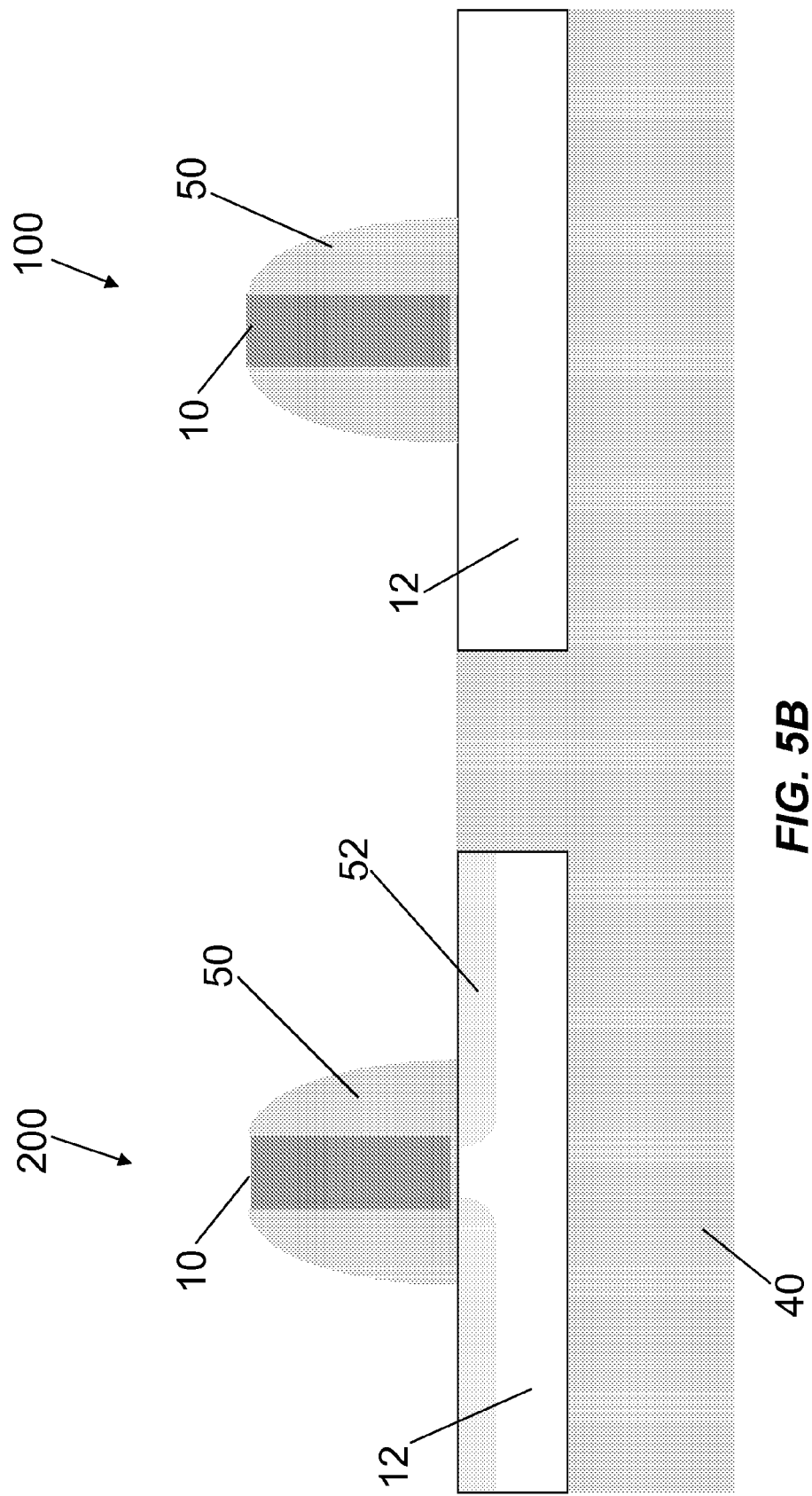

FIGS. 5A-5E illustrate exemplary steps that can be used to manufacture an eFuse 100. FIGS. 5A-5E illustrate the manufacture of an anti-fuse 100 alongside a metal oxide semiconductor field effect transistor (MOFSET) 200 on a silicon-on-insulator (SOI) substrate 40. FIG. 5A schematically illustrates shallow trench isolation (STI) 12 and gate 10 formation.

As shown in FIG. 5B, offset spacers (such as an oxide layer) 50 are formed on the sidewalls of gates 10. Offset spacers 50 may each extend the length of a respective one of gates 10, and may each be, e.g., approximately 10 nm in width. FIG. 5B also illustrates halo implantation 52 on the MOSFET 200. For example, boron (B) halo implantation can be carried out at approximately 10 KeV, $8\times10^{13}$ $cm^{-2}$, at an angle of approximately 30 degrees from normal. Boron difluoride ($BF_2$) extension implantation at, e.g., approximately 3 KeV, $1\times10^{15}$ $cm^{-2}$ may be used, or arsenic (As) halo implantation at approximately 60 KeV, $5\times10^{13}$ $cm^{-2}$, at an angle of approximately 30 degrees from normal, alternatively may be used.

Referring to FIG. 5C, deep source/drain implantation and dopant activation are then performed on the MOSFET 200. For example, phosphorus (P) implantation at 45 KeV, $1\times10^{15}$ $cm^{-2}$, may be used. FIG. 5D illustrates resist 60 formation on the MOSFET 200 and nitride spacer etching at the fuse area 100.

Figure 5G:
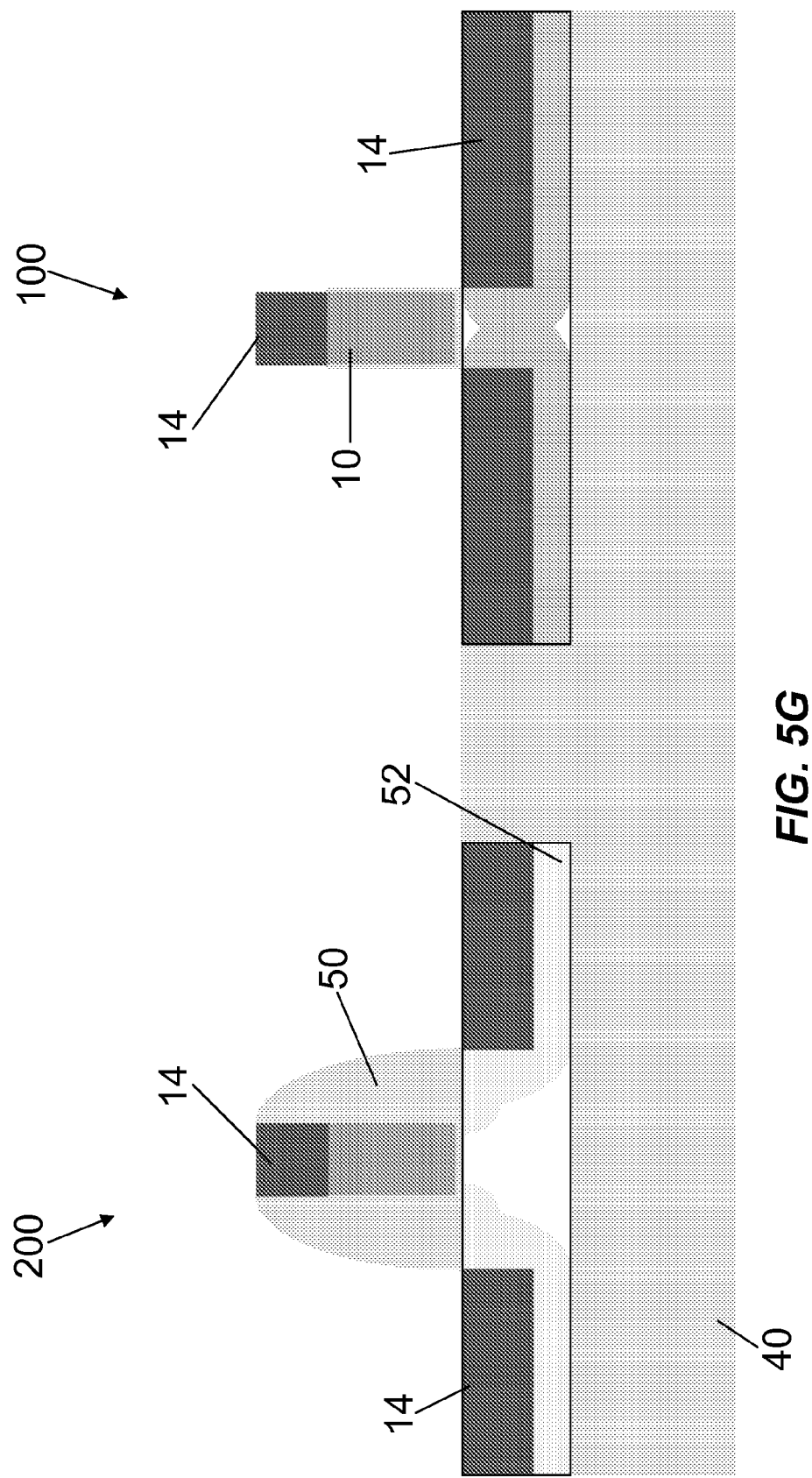
Figure 5H:
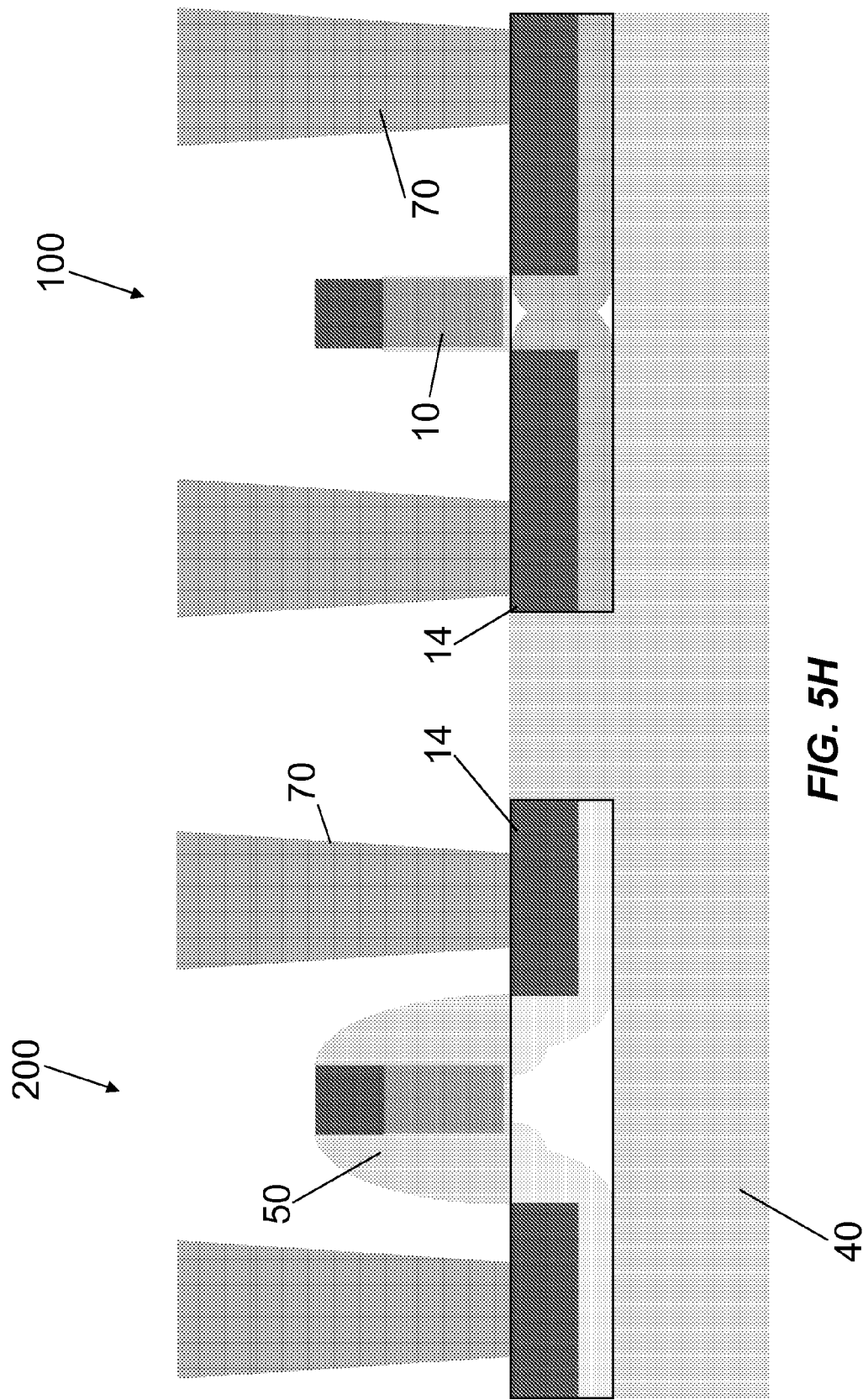

FIG. 5E illustrates applying tilted amorphization implant to the fuse area 100. The tilted amorphization implant may be carried out using F, Ge, Si, Xe, As, or combinations thereof. For example, Ge implantation at 20 KeV, $1\times10^{15}$ $cm^{-2}$, may be used. After amorphization of the fuse area 100, a layer of Ni/TiN 70 is deposited over the MOSFET 200 and fuse 100 areas, as illustrated in FIG. 5F. As illustrated in FIG. 5G, the NiSi layer 14 then can be formed by annealing and selective wet etching. FIG. 5H illustrates MOL deposition and W contact plug 70 formation.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. An electrical fuse comprising:
   a semiconductor substrate;
   a conductive or partially conductive gate; wherein the semiconductor substrate comprises a pipe region below the gate and first and second electrode regions adjacent the pipe region, the pipe region being amorphized and continuous between the first and second electrode regions, the pipe region being adapted for forming a connection region by diffusion upon application of a programming voltage; and
   a metal silicide layer on the semiconductor substrate in the first and second electrode regions.

2. The electrical fuse of claim 1 wherein the gate comprises polysilicon.

3. The electrical fuse of claim 1 wherein the metal silicide is selected from the group consisting of nickel silicide, cobalt silicide, titanium silicide, palladium silicide, platinum silicide, erbium silicide, and combinations thereof.

4. The electrical fuse of claim 1 wherein the pipe region is amorphized by tilted amorphization implant.

5. The electrical fuse of claim 4 wherein the tilted amorphization implant is carried out using ions selected from the group consisting of F, Ge, Si, Xe, As, and combinations thereof.

6. A silicon-on-insulator complementary metal oxide semiconductor large system integration (SOI CMOS LSI) device comprising the electrical fuse of claim 1.

7. A bulk complementary metal oxide semiconductor large system integration (CMOS LSI) device comprising the electrical fuse of claim 1.

8. A device selected from the group consisting of programmable read-only memory (PROM), field-programmable gate array (FPGA), programmable array logic (PAL), and very large system integration (VLSI) chips having at least one of SRAM and DRAM, the device comprising the electrical fuse of claim 1.

9. An anti-fuse comprising:
- a semiconductor substrate;
- a polysilicon gate formed on the semiconductor substrate; wherein the semiconductor substrate comprises a pipe region generally below the gate and first and second electrode regions adjacent the pipe region, the pipe region being amorphized and continuous between the first and second electrode regions, the pipe region being adapted for forming a connection region by diffusion upon application of a programming voltage; and
- a nickel silicide layer formed on the semiconductor substrate in the first and second electrode regions.

10. A method of manufacturing an electrical fuse comprising:
- providing a semiconductor substrate;
- forming a conductive or partially conductive gate on the semiconductor substrate; wherein the semiconductor substrate comprises a pipe region below the gate and first and second electrode regions adjacent the pipe region, the pipe region being amorphized and continuous between the first and second electrode regions, the pipe region being adapted for forming a connection region by diffusion upon application of a programming voltage; and
- depositing a metal silicide layer on the semiconductor substrate in the first and second electrode regions.

11. The method of claim 10 wherein the gate comprises polysilicon.

12. The method of claim 10 wherein the metal silicide is selected from the group consisting of nickel silicide, cobalt silicide, titanium silicide, palladium silicide, platinum silicide, erbium silicide, and combinations thereof.

13. The method of claim 10 wherein the pipe region is amorphized by applying a tilted amorphization implant.

14. The method of claim 13 wherein the tilted amorphization implant is carried out using ions selected from the group consisting of F, Ge, Si, Xe, As, and combinations thereof.

15. The electrical fuse of claim 1 further comprising a connection region diffused through the pipe region and continuous between the first and second electrode regions.

16. The anti-fuse of claim 9 further comprising a connection region diffused through the pipe region and continuous between the first and second electrode regions.

* * * * *